US010261157B2

(12) United States Patent
Sutton et al.

(10) Patent No.: US 10,261,157 B2
(45) Date of Patent: Apr. 16, 2019

(54) METHOD AND SYSTEM FOR MULTI-SHOT SPIRAL MAGNETIC RESONANCE ELASTOGRAPHY PULSE SEQUENCE

(71) Applicant: THE BOARD OF TRUSTEES OF THE UNIVERSITY OF ILLINOIS, Urbana, IL (US)

(72) Inventors: Bradley Sutton, Savoy, IL (US); John G. Georgiadis, Champaign, IL (US); Curtis Johnson, Urbana, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 966 days.

(21) Appl. No.: 14/178,355

(22) Filed: Feb. 12, 2014

(65) Prior Publication Data
US 2014/0232395 A1 Aug. 21, 2014

Related U.S. Application Data

(60) Provisional application No. 61/765,919, filed on Feb. 18, 2013.

(51) Int. Cl.
*G01V 3/00* (2006.01)
*G01R 33/563* (2006.01)
*G01R 33/565* (2006.01)
*G01R 33/48* (2006.01)

(52) U.S. Cl.
CPC . *G01R 33/56358* (2013.01); *G01R 33/56509* (2013.01); *G01R 33/4824* (2013.01)

(58) Field of Classification Search
USPC ........................................................ 324/309
See application file for complete search history.

(56) References Cited

U.S. PATENT DOCUMENTS

| 5,245,282 | A | 9/1993 | Mugler et al. |
| 5,592,085 | A | 1/1997 | Ehman |
| 5,825,186 | A * | 10/1998 | Ehman ................... A61B 5/055 324/307 |
| 5,977,770 | A | 11/1999 | Ehman |
| 6,185,447 | B1 | 2/2001 | Alley et al. |
| 6,879,155 | B2 * | 4/2005 | Ehman ............... G01R 33/4833 324/309 |

(Continued)

OTHER PUBLICATIONS

Anderson, AW et al., Analysis and Correction of Motion Artifacts in Diffusion Weighted Imaging. Magn Reson Med 1994;32:379-387.
(Continued)

*Primary Examiner* — Rodney E Fuller
(74) *Attorney, Agent, or Firm* — Guntin & Gust, PLC; Matthew Tropper (57) ABSTRACT

Aspects of the subject disclosure include a system that applies magnetic resonance elastography to a sample to obtain uncorrected k-space data where the magnetic resonance elastography utilizes a multi-shot spin-echo sequence with variable density spiral readout gradients, and adjusts the uncorrected k-space data to corrected k-space data by adjusting a k-space trajectory by shifting a center point for each shot to a new center point according to signal intensity and by adjusting a phase for each shot based on a phase offset that is determined according to the signal intensity.

20 Claims, 7 Drawing Sheets

(56) References Cited

U.S. PATENT DOCUMENTS

| | | | | |
|---|---|---|---|---|
| 7,025,253 | B2* | 4/2006 | Sinkus | A61B 5/055 324/307 |
| 8,290,565 | B2* | 10/2012 | Ehman | A61B 5/416 600/410 |
| 8,508,229 | B2 | 8/2013 | Ehman et al. | |
| 2004/0041563 | A1* | 3/2004 | Lewin | G01R 33/022 324/307 |
| 2006/0012367 | A1 | 1/2006 | Meaney et al. | |
| 2007/0182411 | A1 | 8/2007 | Bammer et al. | |
| 2009/0105582 | A1 | 4/2009 | Dougherty et al. | |
| 2011/0006767 | A1* | 1/2011 | Sack | A61B 5/055 324/309 |
| 2011/0270079 | A1 | 11/2011 | Osman et al. | |
| 2012/0053450 | A1* | 3/2012 | Salcudean | A61B 5/0051 600/421 |
| 2012/0313641 | A1 | 12/2012 | Labadie et al. | |
| 2013/0131490 | A1* | 5/2013 | Huston, III | A61B 5/055 600/410 |
| 2013/0181712 | A1* | 7/2013 | Sutton | G01R 33/56341 324/314 |
| 2014/0107467 | A1* | 4/2014 | Felmlee | G01R 33/56358 600/411 |
| 2014/0114177 | A1 | 4/2014 | Chen et al. | |
| 2014/0159725 | A1* | 6/2014 | Sack | A61B 5/055 324/309 |
| 2014/0232395 | A1 | 8/2014 | Sutton et al. | |
| 2014/0316245 | A1* | 10/2014 | Romano | G06T 7/0012 600/410 |
| 2016/0266225 | A1 | 9/2016 | Johnson | |
| 2018/0106879 | A1 | 4/2018 | Johnson et al. | |

OTHER PUBLICATIONS

Chatelin, S. et al., Fifty Years of Brain Tissue Mechanical Testing: From in Vitro to in Vivo Investigations. Biorheology 2010;47:255-276, Jun. 2010.

Clarkson, et al., A Comparison of Voxel and Surface Based Cortical Thickness Estimation Methods. NeuroImage 2011;57:856-865.

Di Ieva, A. et al., Magnetic Resonance Elastography: a General Overview of Its Current and Future Applications in Brain Imaging. Neurosurg Rev 2010;33:137-145.

Doyley, MM. et al., Thresholds for Detecting and Characterizing Focal Lesions Using Steady-State MR Elastography. Med Phys 2003;30:495-504.

Ehman, et al., Vibration Safety Limits for Magnetic Resonance Elastography. Phys Med Biol 2008;53:925-935.

Freimann, FB et al., Sack I. Alteration of Brain Viscoelasticity After Shunt Treatment in Normal Pressure Hydrocephalus. Neuroradiology 2012;54:189-196.

Glover, et al., Simple Analytic Spiral K-Space Algorithm. Magn Reson Med 1999;42:412-415.

Jenkinson, M. et al., A Global Optimisation Method for Robust Affine Registration of Brain Images. Med Image Anal 2001;5:143-156.

Johnson, Curtis L. , "Imaging the Local Mechanical Properties of the Brain With High-Resolution Magnetic Resonance Elastography", Dissertation for the degree of Doctor of Philosophy in Mechanical Engineering in the Graduate College of the University of Illinois at Urbana-Champaign, 2013, 137 pages.

Karampinos, DC et al., "High-Resolution Diffusion Tensor Imaging of the Human Pons with a Reduced Field-of-View, Multishot, Variable-Density, Spiral Acquisition at 3 T," Magn Reson Med 2009;62:1007-1016.

Kaster, et al., Measurement of the Hyperelastic Properties of Ex Vivo Brain Tissue Slices. J Biomech 2011;44:1158-1163, Jan. 2011.

Kim, D-H et al., Simple Analytic Variable Density Spiral Design. Magn Reson Med 2003;50:214-219.

Li, T. et al., High-Resolution Diffusion-Weighted Imaging with Interleaved Variable-Density Spiral Acquisitions. J Magn Reson Imaging 2005;21:468-475.

Liu, et al., Self-Navigated Interleaved Spiral (SNAILS): Application to High-Resolution Diffusion Tensor Imaging. Magn Reson Med 2004;52:1388-1396.

Liu, G-R et al., Brain Magnetic Resonance Elastography on Healthy Volunteers: a Safety Study. Acta Radiol 2009;50:423-429.

Mariappan, et al., "Magnetic Resonance Elastography: a Review," Clin Anat 2010;23:497-511.

McGarry, MDJ et al., "An Octahedral Shear Strain-Based Measure of SNR for 3D MR Elastography," Phys Med Biol 2011;56:N153-N164.

Murphy, MC , Decreased Brain Stiffness in Alzheimer's Disease Determined by Magnetic Resonance Elastography. J Magn Reson Imaging 2011;34:494-498.

Muthupillai, R. et al., "Magnetic Resonance Elastography by Direct Visualization of Propagating Acoustic Strain Waves," Science 1995;269:1854-1857.

Normand, V. et al., New Insight Into Agarose Gel Mechanical Properties. Biomacromolecules 2000;1:730-738.

Papazoglou, et al., Multifrequency Inversion in Magnetic Resonance Elastography. Phys Med Biol 2012;57:2329-2346.

Pfefferbaum, Adolf et al., "Increased Brain White Matter Diffusivity in Normal Adult Aging: Relationship to Anisotropy and Partial Voluming," Magn Reson Med 2003;49:953-961.

Plewes, DB et al., An Inductive Method to Measure Mechanical Excitation Spectra for MRI Elastography. Concept Magn Reson B 2004;21B:32-39.

Prange, M. et al., Regional, Directional, and Age-Dependent Properties of the Brain Undergoing Large Deformation. J Biomech Eng-T ASME 2002;124:244-252.

Romano, A. et al., In Vivo Waveguide Elastography of White Matter Tracts in the Human Brain. Magn Reson Med 2012, doi: 10.1002/mrm.24141.

Rump, et al., Fractional Encoding of Harmonic Motions in MR Elastography. Magn Reson Med 2007;57:388-395.

Sack, I. et al., A Method for the Noninvasive and Spatially Resolved Observation of Phase Transitions in Gels. J Am Chem Soc 2001;123:11087-11088.

Schregel, K. et al., Demyelination Reduces Brain Parenchymal Stiffness Quantified in Vivo by Magnetic Resonance Elastography. P Natl Acad Sci USA 2012;109:6650-6655.

Sinkus, R. et al., High-Resolution Tensor MR Elastography for Breast Tumour Detection. Phys Med Biol 2000;45:1649-1664.

Smith, S.M. et al., Advances in Functional and Structural MR Image Analysis and Implementation as FSL. NeuroImage 2004;23:S208-S219.

Smith, SM , Fast Robust Automated Brain Extraction. Hum Brain Mapp 2002;17:143-155.

Streitberger, K-J et al., "Sack I. In Vivo Viscoelastic Properties of the Brain in Normal Pressure Hydrocephalus," NMR Biomed 2011;24:385-392.

Streitberger, K-J et al., Brain Viscoelasticity Alteration in Chronic-Progressive Multiple Sclerosis. PLoS One 2012;7:e29888.

Van, AT et al., K-Space and Image-Space Combination for Motion-Induced Phase-Error Correction in Self-Navigated Multicoil Multishot DWI. IEEE T Med Imaging 2009;28:1770-1780.

Van Dommelen, JAW et al., "Mechanical Properties of Brain Tissue by Indentation: Interregional Variation," J Mech BehavBiomed 2010;3:158-166.

Van Houten, DVR et al., Subzone Based Magnetic Resonance Elastography Using a Rayleigh Damped Material Model. Med Phys 2011;38:1993-2004.

Van Houten, EEW et al., Three-Dimensional Subzone-Based Reconstruction Algorithm for MR Elastography. Magn Reson Med 2001;45:827-837.

Wang, H. et al., A Three-Dimensional Quality-Guided Phase Unwrapping for MR Elastography. Phys Med Biol 2011;56:3935-3952.

Wuerfel, J. et al., "MR-Elastography Reveals Degradation of Tissue Integrity in Multiple Sclerosis," NeuroImage 2010;49:2520-2525.

Yin, M. et al., "Assessment of Hepatic Fibrosis with Magnetic Resonance Elastography," Clin Gastroenterol H 2007;5:1207-1213.

Zhang, et al., Segmentation of Brain MR Images Through a Hidden Markov Random Field Model and the Expectation-Maximization Algorithm. IEEE T Med Imaging 2001;20:45-57.

(56) References Cited

OTHER PUBLICATIONS

Zhang, J. et al., Viscoelastic Properties of Human Cerebellum Using Magnetic Resonance Elastography. J Biomech 2011;44:1909-1913.
"International Preliminary Report on Patentability", PCT/US2014/050152, dated May 12, 2016, 7 pages.
Abolfathi, N. et al., "A Micromechanical Procedure for Modelling the Anisotropic Mechanical Properties of Brain White Matter", Computer Methods in Bomechanics and Biomedical Enginerring, vol. 12, No. 3, http://www.tandfonline.com/loi/gcmb20, Apr. 27, 2009, 249-242.
Johnson, C. L. et al., "Interleaved Spiral Sequence for MR Elastography of the Brain", University of Illinois at Urbana-Champaign, 2011, 1474.
Braun et al., "High-resolution mechanical imaging of the human brain by three-dimensional multifrequency magnetic resonance elastography at 7T", Dec. 22, 2013, 7 pages.
"Simultaneous Multislice Accelerated Interleaved EPI DWI Using Generalized Blipped-CAIPI Acquisition and 3D K-Space Reconstruciton", Apr. 19, 2016, 13 pages.
Glover, Gary, "Simple Analytic Spiral K-Space Algorithm", 1999, 4 pages.
Holtrop et al., "Diffusion Weighted Imaging Using Multi-shot Spiral with a Simultaneous Multi-slice Excitation", 2015, 1 page.
Johnson et al., "3D Multislab, Multishot Acquisition for Fast, Whole-Brain MR Elastography with High Signal-to-Noise Efficiency", Dec. 17, 2013, 9 pages.
Johnson et al., "Magnetic Resonance Elastography of the Brain Using Multishot Spiral Readouts with Self-Navigated Motion Correction", Sep. 21, 2012, 9 pages.
Liu et al., "Self-Navigated Interleaved Spiral (SNAILS): Application to High-Resolution Diffusion Tensor Imaging", 2004, 9 pages.
McGarry et al., "An octahedral shear strain-based measure of SNR for 3D MR elastography", Jun. 8, 2011, 13 pages.
McGarry et al., "Multiresolution MR elastography using nonlinear inversion", Oct. 1, 2012, 10 pages.
Murphy et al., "Decreased Brain Stiffness in Alzheimer's Disease Determined by Magnetic Resonance Elastography", 2011, 5 pages.
Murphy et al., "Preoperative assessment of meningioma stiffness using magnetic resonance elastography", Oct. 19, 2012, 6 pages.
Muthupillai et al., "Magnetic Resonance Elastography by Direct Visualization of Propagating Acoustic Strain Waves", Sep. 29, 1995, 5 pages.
Pruessmann, et al., "Advances in Sensitivity Encoding With Arbitrary k-Space Trajectories", 2001, 14 pages.
Streitberger, et al., "High-Resolution Mechanical Imaging of Glioblastoma by Multifrequency Magnetic Resonance Elastography", Oct. 22, 2014, 9 pages.
Sutton, Bradley P. et al., "Fast, Iterative Image Reconstruction for MRI in the Presence of Field Inhomogeneities", IEEE Transactions on Medical Imaging, Vol. 22, No. 2, Feb. 2003, Feb. 2003, 11 pages.
Wong, Eric, "Optimized phase schedules for minimizing peak RF power in simultaneous multi-slice RF excitation pulses", 2012, 1 page.
Wuerfel, et al., "MR-elastography reveals degradation of tissue integrity in multiple sclerosis", Jun. 16, 2009, 6 pages.
Zahneisen, et al., "Three-Dimensional Fourier Encoding of Simultaneously Excited Slices: Generalized Acquisition and Reconstruction Framework", Jul. 22, 2013, 11 pages.

\* cited by examiner

| Subject | | A | B | C | Zhang et al. |
|---|---|---|---|---|---|
| Age (years) | | 24 | 34 | 52 | Average of eight subjects |
| OSS-SNR | | 5.76 | 3.42 | 3.82 | |
| White Matter | $\tilde{\mu}_R$ [kPa] | 2.49 ± 1.02 | 2.59 ± 1.05 | 2.22 ± 1.05 | 2.41 ± 0.23 |
| | $\tilde{\mu}_I$ [kPa] | 1.23 ± 0.75 | 1.11 ± 0.63 | 1.29 ± 0.66 | 1.21 ± 0.21 |
| Grey Matter | $\tilde{\mu}_R$ [kPa] | 1.91 ± 0.97 | 1.82 ± 1.08 | 1.71 ± 1.02 | 2.34 ± 0.22 |
| | $\tilde{\mu}_I$ [kPa] | 0.79 ± 0.58 | 0.65 ± 0.49 | 0.68 ± 0.56 | 1.11 ± 0.03 |

METHOD AND SYSTEM FOR MULTI-SHOT SPIRAL MAGNETIC RESONANCE ELASTOGRAPHY PULSE SEQUENCE

PRIOR APPLICATION

The present application claims the benefit of priority to U.S. Provisional Application No. 61/765,919 filed on Feb. 18, 2013, the disclosure of which is hereby incorporated herein by reference in its entirety.

FIELD OF THE DISCLOSURE

The subject disclosure relates to a method and system for multi-shot spiral magnetic resonance elastography pulse sequence.

BACKGROUND

Identifying mechanical properties of tissues (e.g., brain, liver, breast and so forth) or other samples can be useful for a number of purposes including diagnosis. Mechanical palpation of the tissue can be utilized, but is not an accurate technique and can be invasive depending on the tissue that is being analyzed.

Magnetic Resonance (MR) techniques are being employed for various imaging purposes. However, not all types of MR technique are suitable for every purpose. The type of MR technique and/or the type of sample being analyzed can affect the quality of the images, as well as other factors such as capture time.

BRIEF DESCRIPTION OF THE DRAWINGS

Reference will now be made to the accompanying drawings, which are not necessarily drawn to scale, and wherein.

DETAILED DESCRIPTION

The subject disclosure describes, among other things, illustrative embodiments for providing k-space data correction in multi-shot magnetic resonance elastography. In one or more embodiments, Magnetic resonance elastography (MRE) can be utilized as a non-invasive technique, such as for measuring focal mechanical properties of samples (e.g., brain tissue in vivo). In one or more embodiments, spatial resolution can be increased without compromising image acquisition speed or Signal-to-Noise Ratio (SNR). The MRE sequence can be based on multi-shot and variable-density spiral imaging to measure tissue displacement vectors in 3D with high spatial resolution. In one or more embodiments, a Rayleigh damped model of brain tissue mechanics can be adopted for inversion, and can be employed via a finite element-based iterative inversion algorithm. Examples are described herein, including performing the exemplary method on an agarose gel phantom with embedded inclusions, which demonstrated that spatial resolution plays a role in both detecting and characterizing local variations in viscoelastic properties. In another example, MRE measurements on healthy volunteers were obtained utilizing the exemplary method, which demonstrated that a plethora of white matter structures can be delineated directly from the MRE stiffness maps. The exemplary methods enable mechanical property contrast delineation of white matter structures. Other embodiments are described in the subject disclosure.

In one or more embodiments, MRE can be utilized in clinical practice as a surrogate for mechanical palpation, including in the study of the human brain in vivo by increasing spatial resolution and overcoming complexity of the inverse problem associated with biomechanical property estimation. In one or more embodiments, MRE data acquisition (e.g., from a brain in vivo) can be performed with high spatial resolution and signal-to-noise ratio as quantified by octahedral shear strain metrics. One or more of the exemplary embodiments, the MRE can be based on multi-shot, variable-density spiral imaging and three-dimensional displacement acquisition, and a correction scheme can be employed for any resulting phase errors. One or more of the exemplary embodiments can employ a Rayleigh damped model of brain tissue mechanics to represent the parenchyma, and can be integrated via a finite element-based iterative inversion algorithm.

One embodiment of the subject disclosure is a method including applying, by a system including a processor, magnetic resonance elastography to a sample to obtain uncorrected k-space data, where the magnetic resonance elastography utilizes a multi-shot spin-echo sequence with variable density spiral readout gradients. The method includes adjusting, by the system, the uncorrected k-space data to corrected k-space data by: determining a point of maximum signal intensity for each shot, adjusting a k-space trajectory by shifting a center point for each shot to the corresponding point of maximum signal intensity, and adjusting a phase for each shot by applying a negative of a phase at the corresponding point of maximum signal intensity. The method includes obtaining, by the system, a corrected image by applying a Fourier transform to the corrected k-space data summed over all shots.

One embodiment of the subject disclosure includes a system having an actuator for applying a vibration to a sample, a magnetic resonance system for facilitating applying magnetic resonance elastography to the sample, a processor coupled with the actuator and the magnetic resonance system; and a memory that stores executable instructions. The processor can apply magnetic resonance elastography to the sample to obtain uncorrected k-space data, where the magnetic resonance elastography utilizes a multi-shot spin-echo sequence with variable density spiral readout gradients. The processor can adjust the uncorrected k-space data to corrected k-space data by adjusting a k-space trajectory by shifting a center point for each shot to a new center point according to signal intensity and by adjusting a phase for each shot based on a phase offset that is determined according to the signal intensity.

One embodiment of the subject disclosure includes a computer-readable storage device having computer instructions which, responsive to being executed by a processor, facilitate performance of operations that include applying magnetic resonance elastography to a sample to obtain uncorrected k-space data, where the magnetic resonance elastography utilizes a multi-shot spin-echo sequence with variable density spiral readout gradients. The processor can adjust the uncorrected k-space data to corrected k-space data by adjusting a k-space trajectory by shifting a center point for each shot to a new center point according to signal intensity and by adjusting a phase for each shot based on a phase offset that is determined according to the signal intensity.

In one or more embodiments, an MRE technique is utilized as a non-invasive technique for measuring the mechanical properties of tissues in vivo, such as virtual palpation of or in vivo probing of the liver, breast, skeletal muscle, brain and so forth. For instance, the exemplary embodiments can be utilized in place of or in addition to liver biopsies in the diagnosis of fibrosis. As another example, the MRE with correction of k-space data can be utilized in studies of brain diseases that result in diffuse neuro-degeneration such as multiple sclerosis, normal pressure hydrocephalus, and Alzheimer's disease. Mechanical properties estimated using the MRE process of the exemplary embodiments and averaged over large regions of the parenchyma can correlate with the putative degeneration of brain tissue.

One or more of the exemplary embodiments can overcome the mechanical complexity of the brain as an inhomogeneous and anisotropic medium with properties potentially varying between fine tissue structures, by providing high-resolution, full vector field MRE acquisitions in three dimensions with high SNR in order to resolve focal mechanical properties of brain tissue. The high spatial resolution in the exemplary MRE can be useful with respect to local correlations between decrease in viscoelastic properties and demyelination of white matter as shown in a murine model of multiple sclerosis.

The exemplary MRE provides high-resolution image acquisitions which reduce partial-volume effects, and thus, allow for delineation of finer features. The achievable resolution of the exemplary MRE is influenced by two factors: spatial resolution and SNR of the displacement data. Small-scale variations in the displacement field caused by fine tissue structures are observable by the exemplary MRE with its acquisition of high-resolution displacement data, and smaller structures will become detectable by the inversion process with resolution improvements.

In one or more embodiments, an octahedral shear strain-based SNR (OSS-SNR) measure can be considered as it has been previously demonstrated that an OSS-SNR of 3.0 can give accurate inversion results. Model-data mismatch can also limit the achievable quality of MRE property distributions, as any continuum tissue model is only an approximation of the net effect of enormous numbers of complicated micro-scale interactions. Use of more sophisticated material models can reduce this source of error, however the increase in the number of unknown properties which must be estimated places even more demands on the data, reinforcing the desire for high-resolution, high-SNR displacement images achievable through sue of the exemplary MRE with k-space data correction. In one or more embodiments, a subzone based Non-Linear Inversion (NLI) algorithm can be utilized and the sample (e.g., the tissue) can be modeled as a Rayleigh damped material.

The exemplary embodiments capture local variations in samples (e.g., brain tissue) using MRE, while providing an MR acquisition scheme that enables high-fidelity MRE data to be obtained during a comfortable and safe subject exam. Obtaining high-resolution MRE datasets with adequate SNR relies on the MR sequence used for acquisition. Contemporary processes utilize single-shot, spin-echo echo-planar imaging (EPI) that can provide rapid acquisition, but in high-resolution protocols, single-shot EPI sequences suffer from very long readout durations. Long readouts result in large distortions from field inhomogeneity and also require long echo times, thus reducing SNR and ultimately limiting the resolution achievable in a short scan time. The exemplary embodiments that utilize multi-shot MRE overcome long readouts.

The multi-shot, spin-echo sequence with variable-density spiral readout gradients enables tradeoffs between resolution, overall acquisition time, and field inhomogeneity distortions, while self-navigating properties of the variable-density readout allow for correction of any resulting phase errors. Examples of the multi-shot, spin-echo sequence with variable-density spiral readout gradients are further described in Johnson et al., Interleaved Spiral Sequence for MR Elastography of the Brain. In: Proceedings of the 19th Annual Meeting of ISMRM, Montreal, Quebec, Canada, 2011, p. 1474; and Johnson et al. High-Resolution Multi-Shot MR Elastography of the Brain with Correction for Motion-Induced Phase-Errors. In: Proceedings of the 20th Annual Meeting of ISMRM, Melbourne, Australia, 2012, p. 2517, the disclosures of both of which are hereby incorporated by reference.

Figure 1:
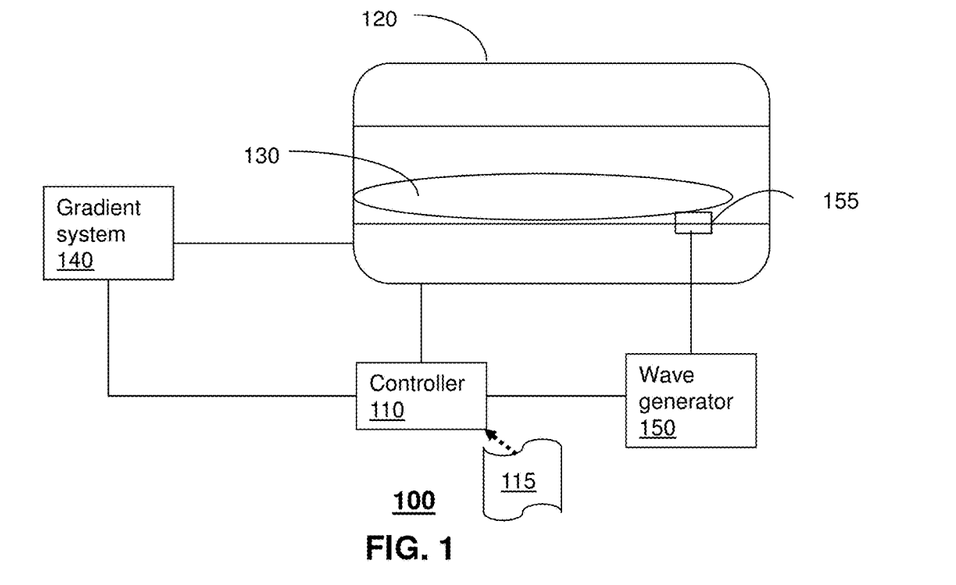
FIG. 1 depicts an illustrative embodiment of a system that applies a multi-shot magnetic resonance elastography pulse sequence with k-space data correction.

Referring to FIG. 1, a system 100 is illustrated that can be utilized for performing MRE, and in particular a multi-shot spin-echo sequence with variable density spiral readout gradients and with k-space data correction. System 100 can include various hardware and software for performing the MRE and k-space data correction, including controller 110, computer instructions 115 (e.g., embodied in a computer-readable storage device), an MRE unit 120 for the sample 130 (e.g., a patient having an organ examined such as brain tissue), a gradient system 140, a wave generator 150 and an actuator 155. System 100 can include various other components not shown in FIG. 1 and/or can include less than all of the components shown in FIG. 1.

System 100 enables a multi-shot spiral acquisition of the sample 130. Data can be acquired through the incorporation of motion-encoding gradients (via gradient system 140) in MRI sequences for mapping displacement to the phase of the MR signal. In one or more embodiments, these gradients can be generally bipolar and can have a period matching to that of a vibration generated via wave generator 150 and actuator 155. In other embodiments, one or more of the gradients are not bipolar. In one embodiment, vibrations in the range of 50-100 Hz can be utilized, such as for examining brain tissue in vivo. The use of spiral-out readout gradients in the exemplary embodiments, which have the entire readout after the echo time, enables shorter echo times for a given level of contrast, which is dependent on the total time of the motion-encoding gradients. As no readout gradients are required before the echo time, the spiral sequence of the exemplary embodiments allows high-resolution, short echo time acquisitions with echo times that are not dependent on the acquired resolution.

Single-shot sequences suffer from very long readout times in high-resolution acquisitions. The long readout time for the single-shot sequences can lead to significant distortions in the presence of magnetic field inhomogeneities and susceptibility differences at air-tissue interfaces. These distortions not only degrade the quality of the image, but may also lead to model/data mismatch during the inversion, which produces errors in the resulting estimates of mechanical properties. As an example, geometric distortions from field inhomogeneity can cause compression and stretching of spatial information in certain regions, which can impact the inversion algorithms for determining mechanical properties.

The exemplary embodiments utilize multi-shot sequences which segment k-space into separately acquired interleaves or shots. This approach reduces the readout time for each acquisition, and provides access to tradeoffs between acquisition time, resolution, and sensitivity to off-resonance effects and $T_2^*$-induced blurring during readout. In one embodiment, parallel imaging could be used to reduce readout duration, and thus the effects of field inhomogeneity, though with a penalty in SNR that would be addressed using averaging to recover.

Figure 2:
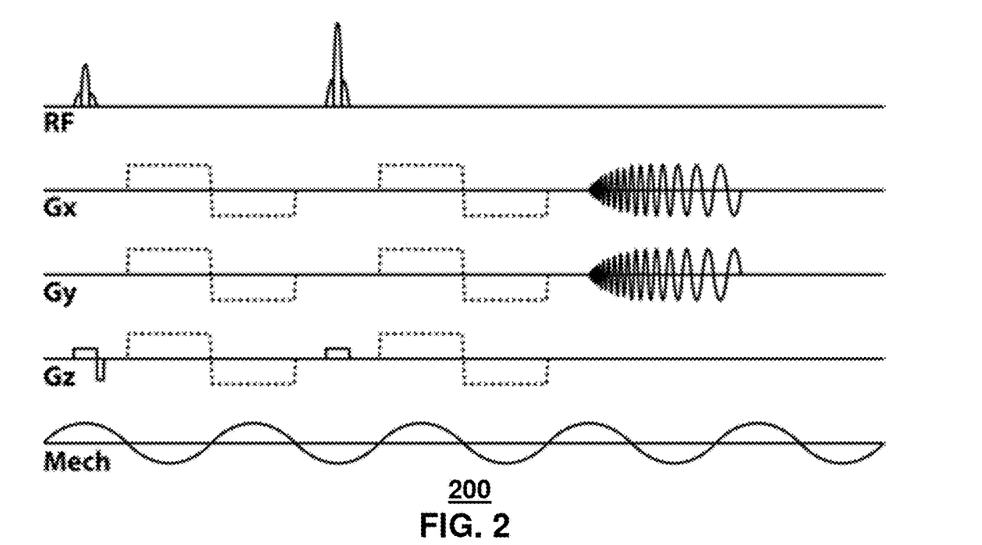
FIG. 2 depicts an illustrative embodiment of magnetic resonance elastography sequence for the system of FIG. 1.

In one embodiment, an MRE sequence that utilizes multi-shot spiral readout gradients is utilized with six shots to acquire a matrix size of 128, giving 2 mm in-plane spatial resolution, with a 15 ms readout duration per shot. The pulse sequence diagram 200 is illustrated in FIG. 2. Diagram 200 illustrates an MRE sequence incorporating multi-shot, variable-density spiral readout gradients, where bipolar motion encoding gradients (dashed lines) are shown on each gradient axis, though they are only applied one at a time. The motion-encoding gradients can be equal in period to the induced vibration (e.g., 50 Hz for the brain in vivo), with a second bipolar gradient pair being placed after the refocusing pulse and one-half period apart. Variable-density spiral readout gradients can be employed, as opposed to constant-density gradients, so that the center of k-space is oversampled with each shot, which provides that the center of k-space is appropriately captured with each acquisition. This also provides a navigator for motion correction as discussed in the following section. Examples of other steps and/or components that can be utilized with the multi-shot, variable-density spiral readout gradients are described in U.S. Pat. No. 7,025,253 to Sinkus, as well as in Kim et al. Simple Analytic Variable Density Spiral Design. Magn Reson Med 2003; 50:214-219, the disclosures of both of which are hereby incorporated by reference.

In one or more embodiments, correction to the k-space data can be performed such as based on motion-induced phase errors. Multi-shot imaging in the presence of motion-encoding gradients can include phase errors between shots, such as from bulk motion not related to the vibrations of interest. This phase error can lead to phase cancellation and signal loss. For an MRE multi-shot sequence, a likely source of phase error arises from variations in mechanical actuation, which may be strained when loaded, such as with the weight of the human head. The applied motion can be assumed to be harmonic with constant amplitude. The same motion can be mapped to the phase of each shot. However, the output from actuators used in MRE does vary in amplitude by a small amount based on their loading, even after reaching an apparent steady-state. Additionally, phase errors may result from brain pulsation since the sequence is not cardiac gated, and also small subject motions not controlled in the experiment.

Accumulated phase in brain MRE can be mostly as a result of rigid body motion (RBM)—the induced shear waves of interest are diminished in amplitude due to protection of the brain by the skull and cerebrospinal fluid. The amplitude of RBM more closely reflects the applied displacement from the actuator, and thus, any variations can lead to phase errors between shots. In effect, variations in RBM appear as an additional, unwanted RBM phase component, which can be described as a combination of translations and rotations corresponding to bulk phase offsets and linear phase ramps, the latter resulting in k-space trajectory shifts.

The measured (and phase corrupted) signal for shot n of a multi-shot image, $\hat{S}^n$, can be described in k-space as (Eq. 1):

$$\hat{S}^n(k_x^n, k_y^n) = e^{i\Delta\varphi^n} \cdot S^n(k_x^n + \Delta k_x^n, k_y^n + \Delta k_y^n). \qquad (1)$$

In Eq. 1, $S^n$ is the desired signal for shot n, $\Delta\varphi^n$ is the bulk phase offset, $k_x^n$ and $k_y^n$ are the nominal k-space trajectories for shot n, and $\Delta k_x^n$ and $\Delta k_y^n$ are the k-space trajectory shifts. As the RBM variations can be different for each shot, all values can be defined for a single shot, n. The corrupted image, $\hat{I}$, is the Fourier transform of the k-space signal summed over all shots (Eq. 2):

$$\hat{I}(x,y) = \mathcal{F}\{\Sigma_{n=1}^N \hat{S}^n(k_x^n, k_y^n)\}. \qquad (2)$$

In order to recover the uncorrupted image, the phase offsets and k-space shifts can be estimated for each shot of each image. Estimation can be accomplished by using the variable-density spiral readouts as appropriate navigators. To register both k-space shifts and phase offsets for each shot of a specific image, the center of k-space can be estimated using the oversampled portion of the spiral readout as the self-navigator, and the k-space center can be determined as the sampled point with maximum signal intensity (Eq. 3):

$$\Delta k_x^n, \Delta k_y^n = \arg\max_{k_x^n, k_y^n} |\hat{S}^n(k_x^n, k_y^n)|. \qquad (3)$$

The phase offset for each shot can be determined as the phase of the center k-space point (Eq. 4):

$$\Delta\varphi^n = \angle \hat{S}^n(\Delta k_x^n, \Delta k_y^n). \qquad (4)$$

Shifts in k-space can be corrected by adjusting the k-space trajectory so the center coincided with this same point of maximum signal intensity, and phase offsets can be registered between shots by multiplying each shot by the negative of the phase. Applying these corrections to the corrupted signal allows the uncorrupted signal to be recovered (Eq. 5):

$$\hat{S}^n(k_x^n - \Delta k_x^n, k_y^n - \Delta k_y^n) \cdot e^{-i\Delta\varphi^n} = S^n(k_x^n, k_y^n) \qquad (5)$$

Finally, the corrected image, I, is the Fourier transform of the corrected k-space data summed over all shots (Eq. 6):

$$I(x,y) = \mathcal{F}\{\Sigma_{n=1}^N S^n(k_x^n, k_y^n)\}. \qquad (6)$$

Figure 3:
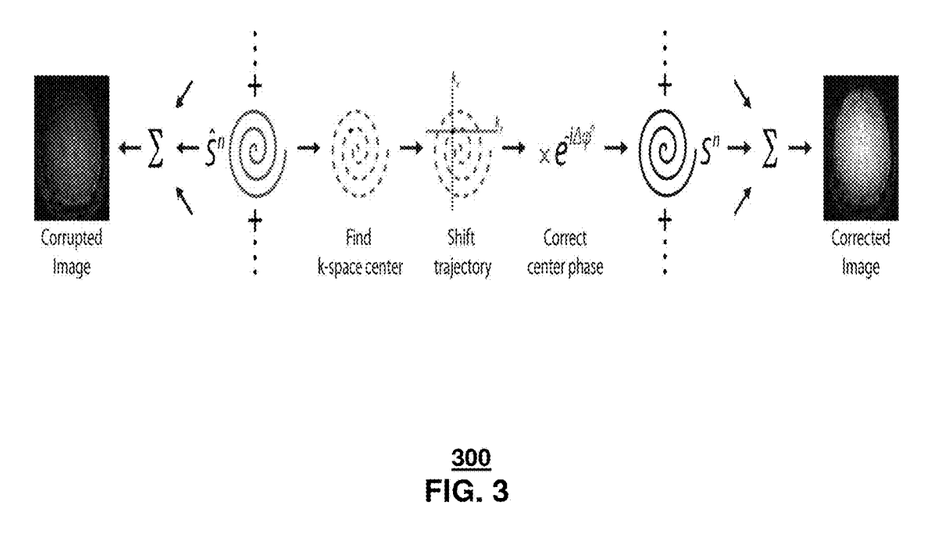
FIG. 3 depicts an illustrative embodiment of a process for k-space data correction used in portions of the system described in FIG. 1.

A schematic diagram 300 depicting the above-described correction steps is illustrated in FIG. 3. Schematic diagram 300 depicts correction for RBM-induced phase errors, including phase offsets and k-space trajectory shifts. The center of k-space is determined for each acquired shot as the point with maximum signal amplitude (black dot). Correction is accomplished by shifting the position of the center and applying the negative of the phase to the signal, resulting in the corrected shot and the uncorrupted image. Spirals and shifts in diagram 300 have been greatly exaggerated only for purposes of display.

In one or more embodiments, material property estimates can be obtained from the corrected measured displacement data. For example, an NLI algorithm can be used to estimate the material properties of the sample 130. The elastographic inversion can be posed as an optimization problem, whereby the function (Eq. 7)

$$\Phi(\theta) = \Sigma_{i=1}^{N} (u_i^c(\theta) - u_i^m)(u_i^c(\theta) - u_i^m)^* \quad (7)$$

can be minimized by iteratively updating the material property description, $\theta$. Here, $u_i^m$ the measured displacement amplitude at location i, $u_i^c(\theta)$ is a computational model of the material behavior (sampled at location i), and the * indicates the complex conjugate. The minimization can be performed using the conjugate gradient method, and a numerical solution of most any conceivable mechanical model can be used for $u_i^c(\theta)$. For this example, a finite element implementation of a nearly incompressible Rayleigh damped material can be used, where the motion amplitude field, u, was calculated from Navier's equation $$\nabla \cdot \mu(\nabla u + \nabla u^T) + \nabla(\lambda \nabla \cdot u) = -\rho \omega^2 u. \quad (8)$$

Here, $\lambda$ is the first Lamé parameter, $\mu$ is the second Lamé parameter, or the shear modulus, $\rho$ is the density, and $\omega$ is the actuation frequency. In a Rayleigh damped model, both shear modulus and density are complex-valued and account for two mechanisms of damping: the imaginary shear modulus includes damping effects proportional to the elastic forces in the material, and the imaginary density provides damping related to inertial forces. The combination of these two effects may allow better characterization of the microscale interactions that cause motion attenuation, compared to the more commonly used viscoelastic model, which does not incorporate inertial damping effects. The material properties estimated during the inversion can be the real and imaginary shear modulus, and imaginary part of the density. The real component of the density was set to 1020 kg/m³, and $\lambda$ was assumed to be large ($10^8$ Pa) to model the nearly incompressible behavior expected for fluid saturated tissues such as the brain.

For comparison with MRE results using viscoelastic models, others have defined an effective shear modulus, $\tilde{\mu}$, for an equivalent viscoelastic material (Eq. 9):

$$\tilde{\mu} = \mu \frac{\rho_R}{\rho}. \quad (9)$$

In this equation, $\mu$ is the complex-valued Rayleigh shear modulus, $\rho_R$ is the real-valued density of a viscoelastic model, and $\rho$ is the complex-valued counterpart in the Rayleigh model. In homogeneous property regions, a viscoelastic model with a complex-valued shear modulus of $\tilde{\mu}$ is indistinguishable from the Rayleigh model; however, when spatially varying properties are present (as assumed in nearly all tissues), Rayleigh and viscoelastic damping predict different behavior.

EXAMPLES

A multi-resolution phantom study was performed utilizing the exemplary embodiments to demonstrate the desire for obtaining high-resolution MRE data when estimating focal mechanical properties. The phantom study evaluated the impact of spatial resolution in the MRE acquisition scheme introduced on the detection of features in the resulting stiffness maps. Additionally, measurements on three healthy volunteers demonstrated satisfactory resolution of grey and white matter, and mechanical heterogeneities correspond well with white matter histoarchitecture.

Together, the exemplary embodiments enable MRE scans to provide high-fidelity, spatially-resolved estimates of sample mechanical properties (e.g., in vivo brain tissue) that improve upon most current MRE studies which only report volume averaged stiffness values.

Example 1

The phantom used in the experiments was a rectangular parallelepiped composed of agarose gel (1%) with three stiffer inclusions (2%) embedded. The inclusions were cubes of three different sizes: 10, 15, and 20 mm on a side. Shear waves were generated by vibrating the lower surface of the phantom at 100 Hz.

Images were acquired using a multi-shot spiral MRE sequence with bipolar motion-encoding gradients matched in period to the vibration frequency of 100 Hz, as described above with respect to system 100. MRE encoding was performed on each of the three cardinal gradient directions independently, and a single period of vibration was sampled with eight evenly spaced points. Six interleaved spiral shots were used to cover k-space with a 64×64 matrix size for the phantom, with resolution achieved by adjusting the overall field-of-view: 128, 192, and 256 mm Twenty slices were acquired with 2, 3, or 4 mm thickness, corresponding to the in-plane resolution resulting in isotropic resolutions of 2×2×2, 3×3×3, and 4×4×4 mm³, respectively. The repetition and echo times for all acquisitions were 2000 ms and 35 ms, respectively.

An NLI inversion process was utilized to interpolate the displacements to 1.7 mm resolution, providing approximately 16 nodes per wavelength for the finite element forward problem. Interpolation allows a consistent mesh resolution for the finite element computational model used in the inversion regardless of the data resolution. As a result, the quality of the mechanical property images is primarily governed by the acquired data resolution and the ability to capture small variations in the displacement field. The properties were reconstructed at the resolution of the acquired data to hold the ratio of independent measurements to unknowns constant.

Figure 4:
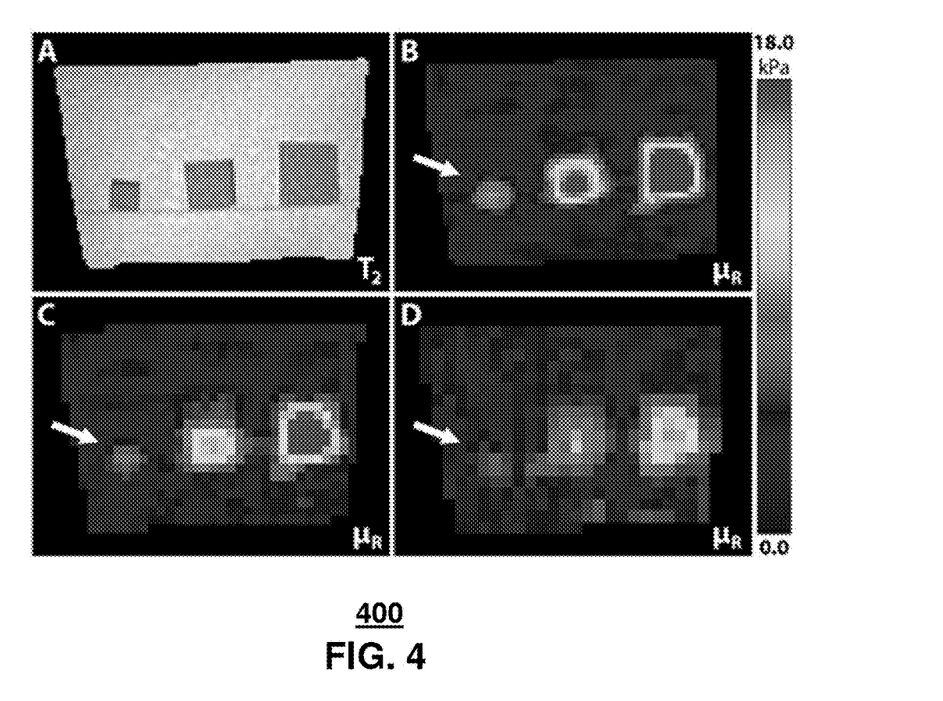
FIG. 4 depicts images for the calculated real shear modulus distributions for an example that utilizes the system of FIG. 1.
Figure 5:
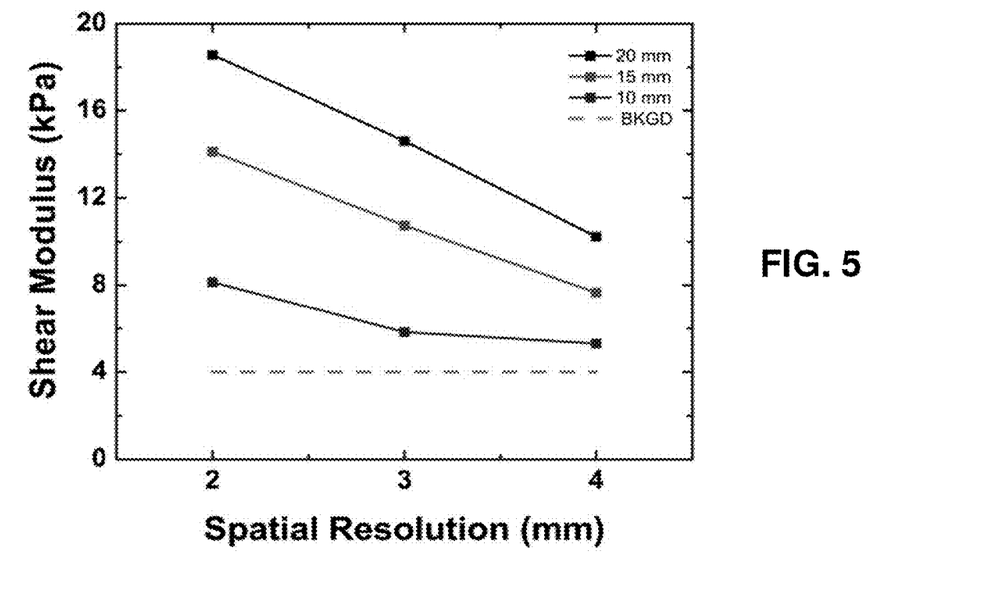
FIG. 5 depicts a graph for the calculated real shear moduli for each inclusion for the example of FIG. 4 that utilizes the system of FIG. 1.

The estimates of real shear modulus illustrates in images 400 of FIG. 4 demonstrate the importance of spatial resolution in MRE. Of the three resolutions investigated—2, 3, and 4 mm—only data acquired at 2 mm and 3 mm allowed detection of the smallest inclusion, which is 10 mm in size and marked by the arrow in FIG. 4. The rectangular shape of the inclusions was also recovered more accurately at higher data resolution. The quantitative characterization of the inclusions also changes with spatial resolution, as the estimated real shear modulus increases with improved resolution and size of the inclusion. The largest inclusion was found to be approximately 18.5 kPa, compared to a 4.0 kPa background, which agrees roughly with expected values from literature, while considering uncertainty due to the sensitivity of agarose shear modulus to thermal history. However, this value was found only with the highest resolution, and was not recovered for the other inclusions or other resolutions, as the estimated contrast decreases with both decreasing size and data acquisition resolution as illustrated in FIG. 5 which illustrates the calculated real shear moduli of each inclusion compared to background plotted against isotropic spatial resolution used to obtain displacement data. This finding is consistent with Doyley et al. Thresholds for Detecting and Characterizing Focal Lesions Using Steady-State MR Elastography. Med Phys 2003; 30:495-504 (the disclosure of which is hereby incorporated by reference), which showed that accurate stiffness characterization of focal inclusions is dependent on size of the heterogeneity.

From the results of the phantom study illustrated in FIGS. 4 and 5, it is apparent that there is a certain resolution relative to inclusion size needed to accurately recover the true shear modulus of the inclusion. Based on this study, we can estimate that approximately ten voxels across the inclusion would be needed for accurate quantification. Additionally, this limit can also depend on frequency of actuation, contrast of inclusion modulus with the background, and SNR. In this phantom study, all acquisitions had very high SNR (OSS-SNR>15), and noise is not expected to have played a role in the results.

Example 2

In vivo brain tissue examination was performed utilizing an exemplary embodiment of the present disclosure. Actuation during the brain MRE study was performed with a system that comprised a remote electromagnetic shaker having a long rod that vibrates a custom cradle the subject's head rests on, similar to the one used in other brain MRE studies. (See Sack et al. Non-Invasive Measurement of Brain Viscoelasticity Using Magnetic Resonance Elastography. NMR Biomed 2008; 21:265-271, the disclosure of which is hereby incorporated by reference). The actuator imparted a nodding motion to the head at the driving frequency of 50 Hz. Imaging was performed in the same manner as the phantom study with motion encoding along three axes and eight samples over a single period. Imaging parameters included: six k-space interleaves; 256 mm field-of-view; 128×128 matrix; 20 axial slices (2 mm thick) in the region of the corpus callosum; 2000/55 ms repetition/echo times. This acquisition resulted in an isotropic resolution of 2×2×2 mm$^3$ and was repeated with negatively polarized gradients to remove background phase effects and to provide a signal average. Total acquisition time was less than 10 minutes.

Each image was reconstructed using the motion correction procedure described above with respect to FIG. 3. Complex-valued subtraction was used to combine corrected images with positive and negative gradient polarization, and the resulting phase images were unwrapped. (See Wang et al. A Three-Dimensional Quality-Guided Phase Unwrapping for MR Elastography. Phys Med Biol 2011; 56:3935-3952, the disclosure of which is hereby incorporated by reference). In this embodiment, motion at the first harmonic was extracted using a temporal Fourier transform, and the result was a set of 3D complex-valued displacements in three motion directions. In this embodiment, no further filtering was applied to the data prior to inversion with the NLI algorithm. To estimate the quality of each acquired MRE dataset, the OSS-SNR was calculated.

In addition to MRE, a $T_1$-weighted MPRAGE scan was acquired for each subject (2000/900/2.2 ms repetition/inversion/echo times; 1×1×1 mm$^3$ resolution). The MPRAGE data was registered to the MRE acquisition and segmentation of grey matter, white matter, and cerebrospinal fluid was performed using the BET, FLIRT, and FAST tools in FSL 4.1.9.

Figure 6:
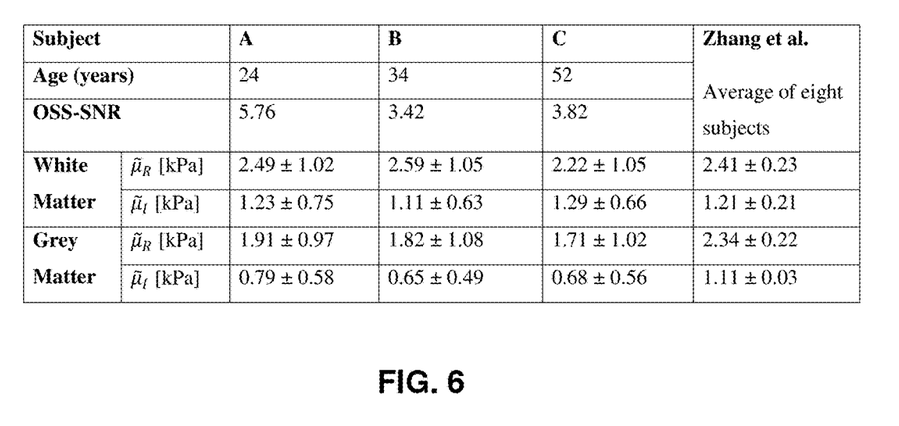
FIG. 6 depicts a summary of calculated viscoelastic equivalent shear moduli for another example that utilizes the system of FIG. 1.

The exemplary embodiment can produce accurate, reliable estimates of the mechanical properties of tissue with NLI algorithms that are dependent on the quality of the acquired MRE displacement images, with quality being defined here as both adequate spatial resolution and measurement SNR. In vivo brain tissue was analyzed utilizing an MRE sequence capable of acquiring high-resolution, high-SNR datasets through multi-shot, variable-density spiral readouts, where participants were all male, and are identified as subjects A, B, and C (24, 34, and 52 years old, respectively) below as illustrated in FIG. 6. All scanning was performed using a Siemens 3T Allegra head-only scanner (Siemens Medical Solutions; Erlangen, Germany).

Figure 7:
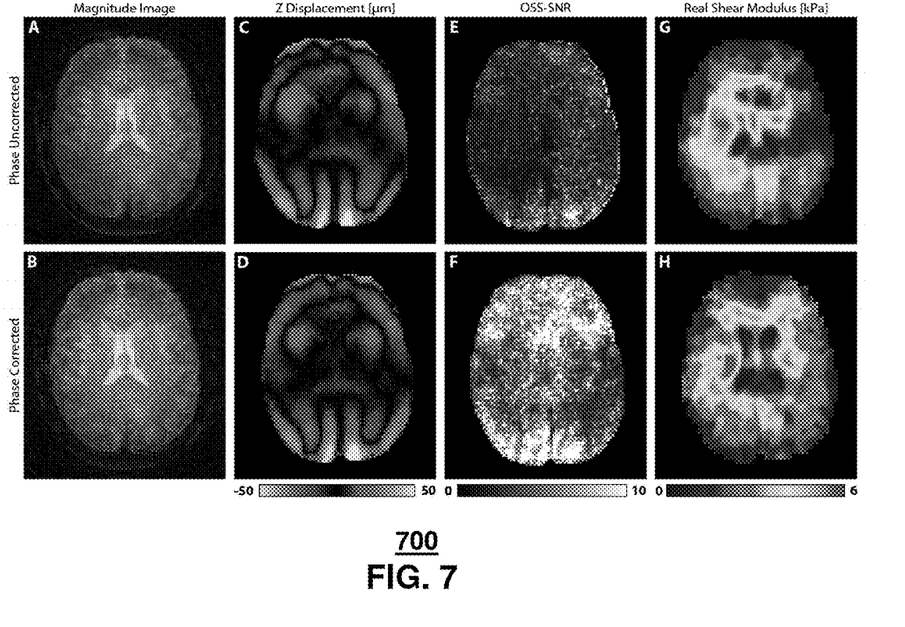
FIG. 7 depicts images comparing magnetic resonance elastography data without and with phase correction for the example of FIG. 6 that utilizes the system of FIG. 1.

Referring to images 700 of FIG. 7, a comparison of MRE data without (top row) and with (bottom row) phase correction is shown: (A and B) magnitude from raw MRE images; (C and D) displacement in the Z direction (superior/inferior); (E and F) resulting OSS-SNR distributions; and (G and H) calculated real shear modulus distributions. Multi-shot imaging introduces the need to account for phase errors between shots, which result in loss of signal in the MR images as observed in FIG. 7A. In MRE, these phase errors can be attributed to variations in the amplitude of motion imparted by the actuator, which effectively contributed an additional, erroneous RBM phase component to the signal. We corrected for these phase errors using the technique described above with respect to FIG. 3, which led to a marked increase in image quality (FIG. 7B). This correction leads to high-quality MRE displacement data, as visualized in FIG. 7D. There is a visible increase in quality over the uncorrected displacement data (FIG. 7C), especially in the left/right asymmetry in shear wave pattern.

Improvements in the quality of MRE data can be visualized through the calculated OSS-SNR distributions (FIGS. 7E-7F). Signal loss in the MR images leads to an increase in noise in the displacement fields calculated from the phase, and significantly decreases the OSS-SNR to levels that are below the threshold required for accurate inversion, which is approximately 3.0. Correction for RBM-induced phase errors results in the recovery of high fidelity displacement data with an improvement in OSS-SNR by a factor of approximately 1.5 across all subjects. In this example, the OSS-SNR value was determined as the average over the imaged volume, though the distribution (in FIG. 7F) demonstrates that data with high OSS-SNR is obtained even in the center of the brain where motion is significantly attenuated. The correction for phase errors also improves the resulting shear modulus distributions, shown in FIG. 7G-7H. The distribution calculated from the uncorrected data demonstrates significant left/right asymmetry compared with the corrected data. Additionally, anatomical features visible in the corrected data are obscured in the uncorrected data.

The mechanical properties of white and cortical grey matter have been reported in several MRE studies. In FIG. 6, a comparison with the values reported by Zhang et al. (Zhang et al. Viscoelastic Properties of Human Cerebellum Using Magnetic Resonance Elastography. J Biomech 2011; 44:1909-1913, the disclosure of which is hereby incorporated by reference) is illustrated, which also used a 3D mechanical model. It should be noted that the values from Zhang are the averages over eight subjects (aged 22-43 years) of their average white and grey matter moduli, and thus the standard errors of those measures are not directly comparable to the standard errors reported for each of the subject in this study. In general, good agreement occurs for both $\tilde{\mu}_R$ and $\tilde{\mu}_I$ of white matter; however, the $\tilde{\mu}_R$ and $\tilde{\mu}_I$ of grey matter found here are lower than those reported by Zhang, with the difference between white and grey matter reported here being more similar to ex vivo studies. The discrepancy in calculated grey matter values may be related to the increased spatial resolution used in this study (2 mm isotropic vs. 3 mm isotropic), allowing for the two tissue types to be better resolved in our example, as demonstrated by the multi-resolution phantom study described with respect to Example 1.

Figure 8:
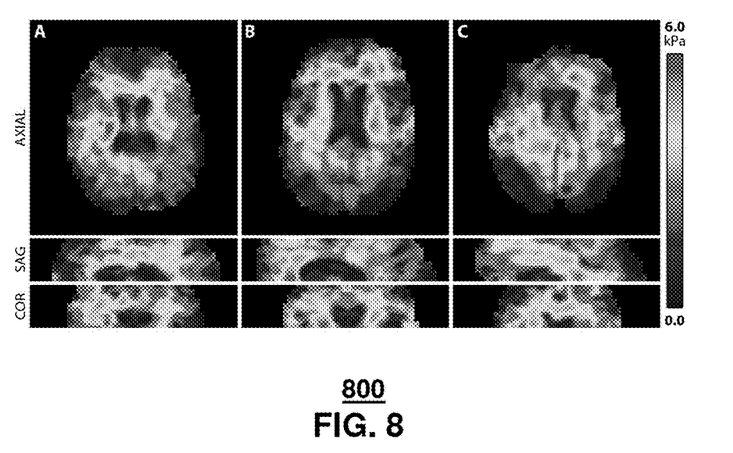
FIG. 8 depicts images showing real shear modulus distributions for the example of FIG. 6 that utilizes the system of FIG. 1.

Referring to images 800 of FIG. 8, Axial (top), sagittal (mid), and coronal (bottom) views are shown of real shear modulus distribution from all three volunteers (A, B, and C), where the images are presented in radiology convention (subject right is image left; subject anterior is image left in sagittal panel). The exemplary embodiments allow brain MRE to capture local variations in the viscoelastic properties of the tissue. By obtaining brain MRE data with high spatial resolution and adequate SNR, the exemplary embodiments can identify structures in the white matter based on their shear stiffness. Referring to the top row of FIG. 8, which shows the real shear modulus on a single slice through the genu and splenium of the corpus callosum for each of the three volunteers, the two ventricles are clearly outlined as soft regions. This is expected as the ventricles are fluid-filled structures and should exhibit zero shear modulus, though in this case they are modeled along with the tissue as a solid and must have finite stiffness. Qualitatively, the genu of the corpus callosum and the forceps anterior tracts can be identified as stiffer regions in each subject on the axial slice, while the body of the corpus callosum can be identified superior to the ventricles in the sagittal and coronal planes. The importance of spatially resolving the mechanical properties of the corpus callosum became clear by a recent MRE study of a murine model of multiple sclerosis (see Schregel et al. Demyelination Reduces Brain Parenchymal Stiffness Quantified in Vivo by Magnetic Resonance Elastography. P Natl Acad Sci USA 2012; 109:6650-6655. Additionally, the corticospinal tracts inferior to the corona radiata appear as very stiff regions to the left and right of the ventricles in the axial view, though are not uniform bilaterally. The coronal plane reveals the corona radiata tracts themselves superior to regions of lower stiffness corresponding to grey matter of the lateral sulci.

Example 2 illustrates qualitative evidence that high-resolution MRE is capable of resolving local variations in tissue stiffness which correlate with the white matter structures in the brain. In a "waveguide elastography" study (see Romano et al. In Vivo Waveguide Elastography of White Matter Tracts in the Human Brain. Magn Reson Med 2012, doi: 10.1002/mrm.24141) the corticospinal tracts were first delineated by fiber tracking prior to applying an anisotropic inversion for the evaluation of the elastic parameters. The regional variation of mechanical properties, however, seems to be consistent with the variation of the volume fraction of axons, as demonstrated by Abolfathi et al. (see Abolfathi et al. A Micromechanical Procedure for Modelling the Anisotropic Mechanical Properties of Brain White Matter. Comput Method Biomec 2009; 12:249-262.), which considered the white matter as a composite medium consisting of axons embedded in a matrix. This representation is consistent with the data presented in FIG. 8. Indeed, regions with highly oriented axons (corpus callosum, corticospinal tracts, corona radiata) have higher volume fraction of axons and higher viscoelastic values. In one or more embodiments, system 100 can be utilized for quantifying the mechanical properties of individual structures in the white matter architecture.

The estimated real shear modulus of the phantom study of Example 1 was calculated for each of the three datasets (2, 3, and 4 mm isotropic resolutions), and the resulting distributions are presented in FIG. 4 along with a $T_2$-weighted image clearly depicting the inclusions (cubes of size 10, 15, and 20 mm). The average estimated stiffness of each inclusion, as measured with each resolution, was calculated over regions-of-interest, and is presented in FIG. 5.

Though the phantom study data of Example 1 did not exhibit significant motion-induced phase errors, such errors were prevalent in the in vivo brain data from Example 1 due to the increased loading of the head on the actuator. The motion-induced phase error correction method of Example 1 provides significantly increased coherence and SNR across shots for in vivo brain data, thus leading to an improvement in the calculated mechanical property distributions, as shown in FIG. 7. Signal lost due to phase cancellation is recovered, as seen in the magnitude of the raw MRE images before processing (portions 7A-7B). This signal recovery leads to an improvement in the quality of MRE displacement data (portions 7C-7D) as assessed by OSS-SNR, which is presented for the same slice in portions 7E-7F. The mean OSS-SNR for this dataset before recovery was 3.47 and after recovery was 5.76, demonstrating a gain of 1.66 for this subject. The mean OSS-SNR for each phase-corrected dataset was calculated by averaging over the imaged volume, excluding regions of cerebrospinal fluid, and these results are presented in FIG. 6. Finally, the real shear modulus distributions calculated from data without and with phase correction are given in FIG. 7G-7H.

Real shear modulus distributions of all three volunteers are presented in FIG. 8 as axial slices with sagittal and coronal reformats around the corpus callosum. For an equivalent estimate of the complex viscoelastic shear modulus, the data was converted using Eq. 9. For each subject, the average real and imaginary parts of the equivalent viscoelastic modulus ($\bar{\mu}_R$ and $\bar{\mu}_I$, respectively) were determined for both white matter and grey matter of the cerebral cortex, and the results are presented in FIG. 6. Also included in FIG. 6 are values reported in the brain MRE literature for comparison.

Figure 9:
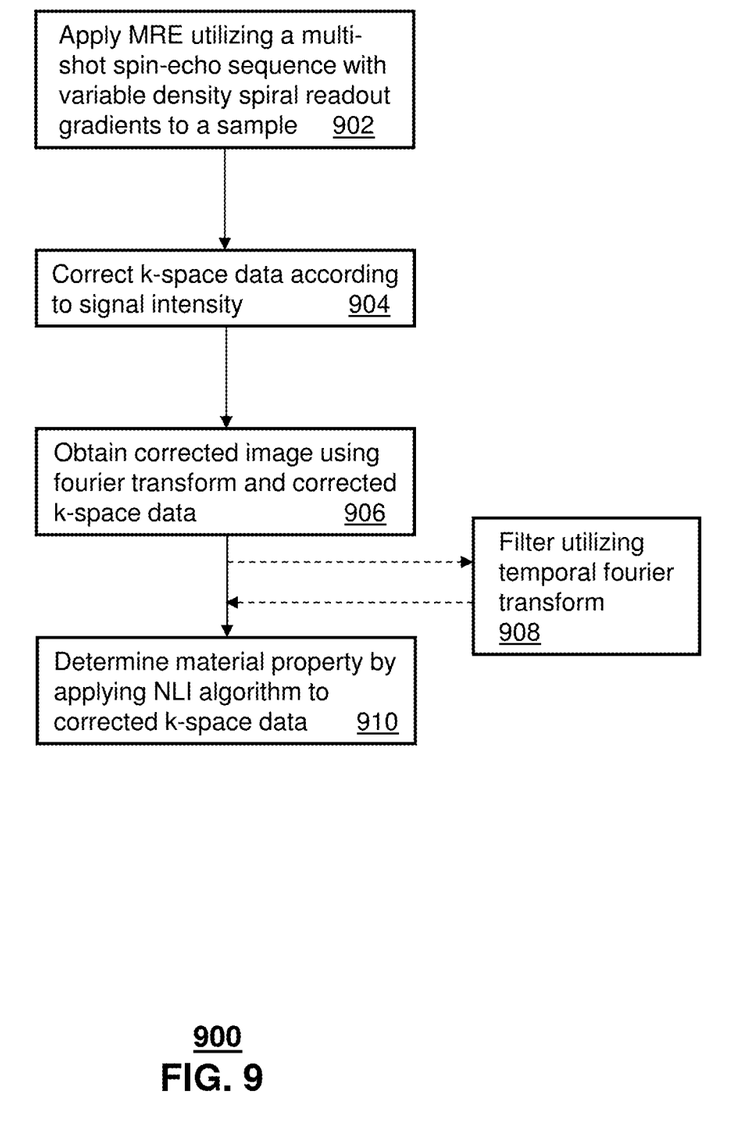
FIG. 9 depicts an illustrative embodiment of a method for providing k-space data correction in multi-shot magnetic resonance elastography.

FIG. 9 illustrates a method 900 for performing MRE on a sample, such as a brain in vivo, although the sample can be other human organs or other objects. At 902, MRE can be applied to the sample to obtain uncorrected k-space data. In one embodiment, the MRE can utilize a multi-shot spin-echo sequence with variable density spiral readout gradients. The number of shots can vary, such as two or more (e.g., five), depending on a number of factors, including the type of material being analyzed (e.g., brain tissue, liver tissue, breast tissue, skeletal muscle, and so forth). Other parameters associated with the MRE can also be varied depending on various factors including the type of material being examined. For instance, the MRE can utilize a particular vibration frequency or acquisition time depending on the material being analyzed. In one embodiment, the motion-encoding gradients can be bipolar with a period that matches the vibration.

At 904, the k-space data can be adjusted to generate corrected k-space data. The correction process can include re-registering each shot as to center position and phase according to signal intensity. For instance, a point of maximum signal intensity can be determined for each shot. A k-space trajectory can be adjusted by shifting a center point for each shot to the corresponding point of maximum signal intensity. A phase for each shot can then be adjusted by applying a negative of a phase at the corresponding point of maximum signal intensity.

At 906, a corrected image can be obtained by applying a Fourier transform to the corrected k-space data summed over all shots of the MRE process. In one embodiment at 908, the corrected k-space data can be filtered. For example, a temporal Fourier transform can be applied to the corrected k-space data to remove motion at a first harmonic. The filtering can be limited to removing the motion at the first harmonic or other filtering can be applied to the corrected k-space data.

At 910, the corrected k-space data can be further analyzed to obtain material properties associated with the sample. For example, an NLI algorithm can be applied to the corrected k-space data to determine or otherwise estimate the shear modules associated with the sample.

In Example 1 and 2 described above, MRE measurements are performed on phantoms in order to demonstrate the benefits of a high-resolution MRE acquisition, and on three healthy subjects to highlight the potential clinical advantages afforded by the improved scheme. The exemplary embodiments enabled acquiring full-vector field MRE displacement data at an isotropic 2×2×2 mm$^3$ resolution on human subjects with an OSS-SNR over 3.0, with a total acquisition time under 10 minutes, well within the limits for safety. In these examples, an advanced 3D mechanical model and inversion method has been adopted that has not previously been applied to human brain MRE data.

The exemplary embodiments can include other techniques to be utilized with respect to the capturing of the k-space data and/or with respect to the correction of the k-space data, such as described in U.S. Patent Publication 2013/0181712 to Sutton, the disclosure of which is hereby incorporated by reference.

Figure 10:
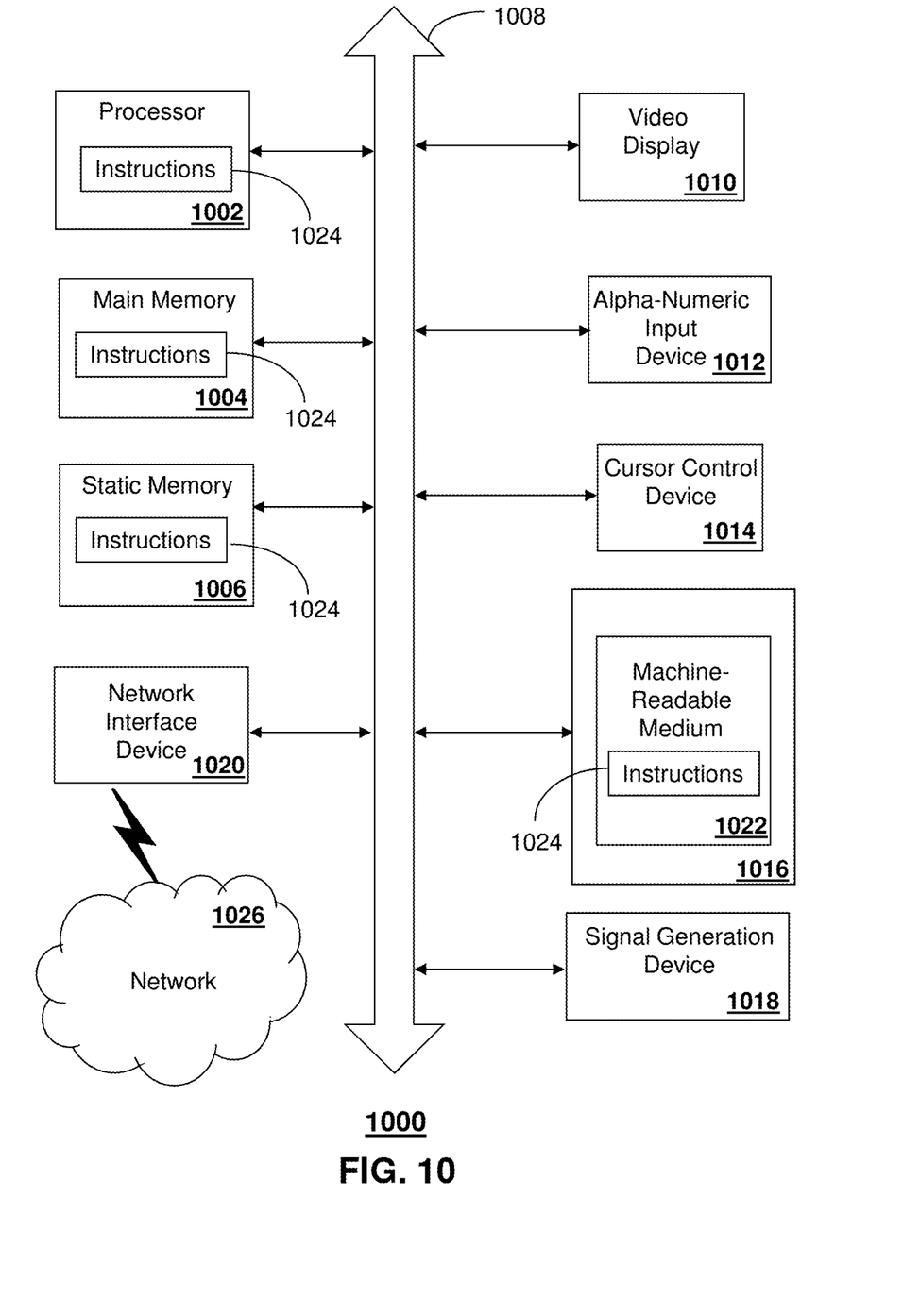
FIG. 10 is a diagrammatic representation of a machine in the form of a computer system within which a set of instructions, when executed, may cause the machine to perform any one or more of the methods described herein.

FIG. 10 depicts an exemplary diagrammatic representation of a machine in the form of a computer system 1000 within which a set of instructions, when executed, may cause the machine to perform any one or more of the methods described above. One or more instances of the machine can operate, for example, as the controller 110, the MRE system 120, the gradient system 140 and the wave generator 150. In some embodiments, the machine may be connected (e.g., using a network 1026) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1000 may include a processor (or controller) 1002 (e.g., a central processing unit (CPU)), a graphics processing unit (GPU, or both), a main memory 1004 and a static memory 1006, which communicate with each other via a bus 1008. The computer system 1000 may further include a display unit 1010 (e.g., a liquid crystal display (LCD), a flat panel, or a solid state display). The computer system 1000 may include an input device 1012 (e.g., a keyboard), a cursor control device 1014 (e.g., a mouse), a disk drive unit 1016, a signal generation device 1018 (e.g., a speaker or remote control) and a network interface device 1020. In distributed environments, the embodiments described in the subject disclosure can be adapted to utilize multiple display units 1010 controlled by two or more computer systems 1000. In this configuration, presentations described by the subject disclosure may in part be shown in a first of the display units 1010, while the remaining portion is presented in a second of the display units 1010.

The disk drive unit 1016 may include a tangible computer-readable storage medium 1022 on which is stored one or more sets of instructions (e.g., software 1024) embodying any one or more of the methods or functions described herein, including those methods illustrated above. The instructions 1024 may also reside, completely or at least partially, within the main memory 1004, the static memory 1006, and/or within the processor 1002 during execution thereof by the computer system 1000. The main memory 1004 and the processor 1002 also may constitute tangible computer-readable storage media.

Dedicated hardware implementations including, but not limited to, application specific integrated circuits, programmable logic arrays and other hardware devices can likewise be constructed to implement the methods described herein. Application specific integrated circuits and programmable logic array can use downloadable instructions for executing state machines and/or circuit configurations to implement embodiments of the subject disclosure. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit or field programmable gate array. Furthermore, software implementations (e.g., software programs, instructions, etc.) including, but not limited to, distributed processing or component/object distributed processing, parallel processing, or virtual machine processing can also be constructed to implement the methods described herein. It is further noted that a computing device such as a processor, a controller, a state machine or other suitable device for executing instructions to perform operations or methods may perform such operations directly or indirectly by way of one or more intermediate devices directed by the computing device.

While the tangible computer-readable storage medium 1022 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure. The term "non-transitory" as in a non-transitory computer-readable storage includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth®, WiFi, Zigbee), and long-range communications (e.g., WiMAX, GSM, CDMA, LTE) can be used by computer system 1000.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described).

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method comprising:
applying, by an actuator of a system including a processor, an induced vibration to a sample, wherein the induced vibration has an induced vibration period;
applying to the sample, by the system, a first motion-encoding gradient of a magnetic resonance elastography, wherein the first motion-encoding gradient has a first vibration period equal to the induced vibration period, wherein the magnetic resonance elastography utilizes a multi-shot spin-echo sequence, and wherein the magnetic resonance elastography includes a refocusing pulse;
applying to the sample, by the system, a second motion-encoding gradient of the magnetic resonance elastography, wherein the second motion-encoding gradient has a second vibration period equal to the induced vibration period, and wherein the second motion-encoding gradient is separated from the first motion-encoding gradient by one-half of the induced vibration period with the refocusing pulse between the first motion-encoding gradient and the second motion-encoding gradient;

applying to the sample, by the system, a variable density spiral readout gradient of the magnetic resonance elastography;

acquiring by the system, based upon at least a portion of the magnetic resonance elastography that is applied to the sample, a corrupted image that includes uncorrected k-space data;

adjusting, by the system, the uncorrected k-space data to corrected k-space data by:

determining a point of maximum signal intensity for each shot of the multi-shot spin-echo sequence, adjusting a k-space trajectory by shifting a center point for each shot of the multi-shot spin-echo sequence to a corresponding point of maximum signal intensity, and adjusting a phase for each shot of the multi-shot spin-echo sequence by applying a negative of a phase at the corresponding point of maximum signal intensity;

determining, by the system, a corrected image by applying a Fourier transform to the corrected k-space data summed over all shots of the multi-shot spin-echo sequence; and presenting, by the system, the corrected image on a display.

2. The method of claim 1, further comprising determining a material property of the sample by applying an inversion algorithm to the corrected k-space data.

3. The method of claim 2, wherein the material property comprises a shear modulus.

4. The method of claim 1, wherein each of the first motion-encoding gradient and the second motion-encoding gradient is bipolar.

5. The method of claim 4, wherein:
the multi-shot spin-echo sequence comprises an echo time; and
the variable density spiral readout gradient has an entire readout after the echo time.

6. The method of claim 1, wherein:
the multi-shot spin-echo sequence comprises an echo time; and
the variable density spiral readout gradient has an entire readout after the echo time.

7. The method of claim 1, further comprising extracting motion at a first harmonic from the corrected k-space data using a temporal Fourier transform.

8. The method of claim 7, wherein filtering of the corrected k-space data is limited to the extracting of the motion at the first harmonic.

9. The method of claim 1, wherein the sample is an in vivo brain, wherein the multi-shot spin-echo sequence comprises at least two shots, and wherein the induced vibration is between 50 to 100 Hz applied to the in vivo brain.

10. A system comprising:
an actuator for applying an induced vibration to a sample;
a magnetic resonance system for applying magnetic resonance elastography to the sample;
a processor coupled with the actuator and the magnetic resonance system; and
a memory that stores executable instructions which, responsive to being executed by the processor, facilitate performance of operations, the operations comprising:
applying by the actuator the induced vibration to the sample, wherein the induced vibration has an induced vibration period;
applying by the magnetic resonance system to the sample a first motion-encoding gradient of the magnetic resonance elastography, wherein the first motion-encoding gradient has a first vibration period equal to the induced vibration period, wherein the magnetic resonance elastography utilizes a multi-shot spin-echo sequence, and wherein the magnetic resonance elastography includes a refocusing pulse;

applying by the magnetic resonance system to the sample a second motion-encoding gradient of the magnetic resonance elastography, wherein the second motion-encoding gradient has a second vibration period equal to the induced vibration period, and wherein the second motion-encoding gradient is separated from the first motion-encoding gradient by one-half of the induced vibration period with the refocusing pulse between the first motion-encoding gradient and the second motion-encoding gradient;

applying by the magnetic resonance system to the sample a variable density spiral readout gradient of the magnetic resonance elastography;

acquiring by the processor, based upon at least a portion of the magnetic resonance elastography that is applied to the sample, a corrupted image that includes uncorrected k-space data;

adjusting by the processor the uncorrected k-space data to corrected k-space data by adjusting a k-space trajectory by shifting a center point for each shot of the multi-shot spin-echo sequence to a new center point according to signal intensity and by adjusting a phase for each shot of the multi-shot spin-echo sequence based on a phase offset that is determined according to the signal intensity;

determining by the processor a corrected image by applying a Fourier transform to the corrected k-space data summed over all shots of the multi-shot spin-echo sequence; and presenting by the processor the corrected image on a display.

11. The system of claim 10, wherein the adjusting of the k-space trajectory by shifting the center point for each shot of the multi-shot spin-echo sequence to the new center point according to the signal intensity comprises determining a point of maximum signal intensity for each shot of the multi-shot spin-echo sequence and shifting the center point for each shot of the multi-shot spin-echo sequence to a corresponding point of maximum signal intensity.

12. The system of claim 10, wherein the adjusting of the phase for each shot of the multi-shot spin-echo sequence based on the phase offset comprises determining a point of maximum signal intensity for each shot of the multi-shot spin-echo sequence and adjusting the phase for each shot of the multi-shot spin-echo sequence by applying a negative of a phase at a corresponding point of maximum signal intensity.

13. The system of claim 10, wherein the operations further comprise determining, by the processor, a material property of the sample by applying an inversion algorithm to the corrected k-space data.

14. The system of claim 13, wherein the material property comprises a shear modulus.

15. The system of claim 10, wherein:
the multi-shot spin-echo sequence comprises an echo time; and
the variable density spiral readout gradient has an entire readout after the echo time.

16. The system of claim 10, wherein the operations further comprise extracting motion, by the processor, at a first harmonic from the corrected k-space data using a temporal Fourier transform.

17. The system of claim 10, wherein the sample is an in vivo brain, wherein the multi-shot spin-echo sequence comprises at least two shots, and wherein the induced vibration is between 50 to 100 Hz applied to the in vivo brain.

18. A computer-readable storage device comprising computer instructions which, responsive to being executed by a processing system including a processor, facilitate performance of operations, the operations comprising:

applying, by an actuator coupled to the processing system, an induced vibration to a sample, wherein the induced vibration has an induced vibration period;

applying to the sample, by a magnetic resonance system coupled to the processing system, a first motion-encoding gradient of a magnetic resonance elastography, wherein the first motion-encoding gradient has a first vibration period equal to the induced vibration period, wherein the magnetic resonance elastography utilizes a multi-shot spin-echo sequence, and wherein the magnetic resonance elastography includes a refocusing pulse;

applying to the sample, by the magnetic resonance system, a second motion-encoding gradient of the magnetic resonance elastography, wherein the second motion-encoding gradient has a second vibration period equal to the induced vibration period, and wherein the second motion-encoding gradient is separated from the first motion-encoding gradient by one-half of the induced vibration period with the refocusing pulse between the first motion-encoding gradient and the second motion-encoding gradient;

applying to the sample, by the magnetic resonance system, a variable density spiral readout gradient of the magnetic resonance elastography;

acquiring by the magnetic resonance system, based upon at least a portion of the magnetic resonance elastography that is applied to the sample, a corrupted image that includes uncorrected k-space data;

adjusting by the processing system the uncorrected k-space data to corrected k-space data by adjusting a k-space trajectory by shifting a center point for each shot of the multi-shot spin-echo sequence to a new center point according to signal intensity and by adjusting a phase for each shot of the multi-shot spin-echo sequence based on a phase offset that is determined according to the signal intensity;

obtaining by the processing system a corrected image by applying a Fourier transform to the corrected k-space data summed over all shots of the multi-shot spin-echo sequence; and presenting by the processing system the corrected image on a display.

19. The computer-readable storage device of claim 18, wherein the adjusting of the k-space trajectory by shifting the center point for each shot of the multi-shot spin-echo sequence to the new center point according to the signal intensity comprises determining a point of maximum signal intensity for each shot of the multi-shot spin-echo sequence and shifting the center point for each shot of the multi-shot spin-echo sequence to a corresponding point of maximum signal intensity, and wherein the adjusting of the phase for each shot of the multi-shot spin-echo sequence based on the phase offset comprises determining the point of maximum signal intensity for each shot of the multi-shot spin-echo sequence and adjusting the phase for each shot of the multi-shot spin-echo sequence by applying a negative of a phase at the corresponding point of maximum signal intensity.

20. The computer-readable storage device of claim 18, wherein the operations further comprise determining a material property of the sample by applying an inversion algorithm to the corrected k-space data.

* * * * *